United States Patent
Huang et al.

(10) Patent No.: US 6,867,487 B2
(45) Date of Patent: Mar. 15, 2005

(54) FLASH-PREVENTING SEMICONDUCTOR PACKAGE

(75) Inventors: Chien-Ping Huang, Hsinchu (TW); Tzong-Da Ho, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/982,347

(22) Filed: Oct. 18, 2001

(65) Prior Publication Data

US 2002/0180024 A1 Dec. 5, 2002

(51) Int. Cl.⁷ .......................... H01L 23/22; H01L 23/24
(52) U.S. Cl. ..................... 257/687; 257/737; 257/738; 257/778; 257/780; 257/787; 257/788; 257/789; 257/795
(58) Field of Search ........................ 257/687, 737–738, 257/778, 780, 787, 788–789, 795, 688

(56) References Cited

U.S. PATENT DOCUMENTS

| | | | | |
|---|---|---|---|---|
| 5,079,190 A | * | 1/1992 | Mihara | 438/26 |
| 5,197,183 A | * | 3/1993 | Chia et al. | 29/827 |
| 5,218,234 A | | 6/1993 | Thompson et al. | 257/787 |
| 5,535,101 A | | 7/1996 | Miles et al. | 367/808 |
| 5,644,169 A | * | 7/1997 | Chun | 257/787 |
| 5,986,885 A | * | 11/1999 | Wyland | 361/704 |
| 6,038,136 A | | 3/2000 | Weber | 361/783 |
| 6,069,408 A | * | 5/2000 | Honda et al. | 257/787 |
| 6,081,997 A | * | 7/2000 | Chia et al. | 29/841 |
| 6,173,490 B1 | * | 1/2001 | Lee et al. | 29/841 |
| 6,239,487 B1 | * | 5/2001 | Park et al. | 257/712 |
| 6,309,916 B1 | * | 10/2001 | Crowley et al. | 438/127 |
| 6,400,014 B1 | * | 6/2002 | Huang et al. | 257/712 |
| 6,552,428 B1 | * | 4/2003 | Huang et al. | 257/706 |
| 6,645,792 B2 | * | 11/2003 | Oga et al. | 438/123 |
| 6,676,885 B2 | * | 1/2004 | Shimizu et al. | 264/511 |
| 2002/0042160 A1 | * | 4/2002 | Brooks et al. | 438/106 |
| 2002/0109218 A1 | * | 8/2002 | Akram | 257/697 |

* cited by examiner

Primary Examiner—Stephen D. Meier
Assistant Examiner—Ida M. Soward
(74) Attorney, Agent, or Firm—Peter F. Corless; Steven M. Jensen; Edwards & Angell, LLP

(57) ABSTRACT

A semiconductor package and a method for fabricating the same are proposed, wherein, in a molding process for encapsulating a semiconductor chip mounted on a substrate, a mold is used with a molding cavity formed with a plurality of recess portions relatively smaller in height, and with a plurality of air vents for connecting the recess portions to outside of the mold and for ventilate air in the molding cavity. This allows a molding resin used during molding to slow down its flow when flowing into the recess portions, as the molding resin rapidly absorbs heat transmitted from the mold and is increased in viscosity thereof. The slowed down molding resin can therefore be prevented from flashing out of the air vents, so that quality and appearance of the fabricated semiconductor package can be well assured.

5 Claims, 6 Drawing Sheets

FLASH-PREVENTING SEMICONDUCTOR PACKAGE

FIELD OF THE INVENTION

The present invention relates to semiconductor packages and methods for fabricating the same, and more particularly, to a semiconductor package and a method for fabricating the same, in which resin flash can be prevented from occurrence in a BGA (ball grid array) semiconductor package.

BACKGROUND OF THE INVENTION

A ball grid array (BGA) semiconductor package employs advanced semiconductor packaging technology, in which a substrate has a front side for mounting a semiconductor chip thereon and a back side for disposing a plurality of solder balls thereon, so as to provide high density of I/O connections, and to bond and electrically connect the semiconductor package to an external printed circuit board.

A flip chip ball grid array (FCBGA) semiconductor package is an improved BGA semiconductor package, wherein the semiconductor chip is bonded in an upside down manner to the front side of the substrate via a plurality of solder bumps, and is electrically connected to external devices, thereby making the overall packaging size further reduced.

However, after the semiconductor chip is placed in position on the substrate, a cavity (hereinafter called "undercavity") is formed between the semiconductor chip and the substrate at intervals between the adjacent solder bumps. If this undercavity is not filled with an insulative material, due to the difference in coefficient of thermal expansion (CTE) between the chip and the substrate, during a temperature cycle in subsequent processes, the chip and the substrate respectively suffer different thermal stress, thereby easily resulting in structural cracks or electricity loss. Therefore, in such a FCBGA semiconductor package, a flip chip underfilling process is necessarily performed to fill the undercavity with an insulative material such as epoxy resin, so as to strengthening the semiconductor structure.

The flip chip underfilling technology has been disclosed in U.S. Pat. No. 5,535,101 titled as "Leadless Integrated Circuit Package" and in U.S. Pat. No. 5,218,234 titled as "Semiconductor Device with Controlled Spread Polymeric Underfill". However, this technology has the following drawbacks. First, it is time-consuming. In such a flip chip underfilling process, the insulative material is filled in a capillary filling manner around the chip; thus, the material filling is often too slow with voids easily being formed. Further, as recited in "Encapsulants Used in Flip-Chip Package" by Suryanarayna et al, the filling time is reported to be proportional to the square of the chip length; as the size of the chip increases, the filling time is prolonged, thereby making the yield further reduced. Besides, an ideal underfilling material is characterized with good fluidity and wettability, and in order to avoid improper thermal stress generated from the underfilling material against the solder bumps, a solid filler is usually added to the underfilling material, making the underfilling material with the solid filler more similar in CTE to the solder bumps. However, the addition of the solid filler greatly increases the viscosity and cost of the underfilling material.

U.S. Pat. No. 6,038,136 discloses a molded underfilling technology. As shown in FIG. 1, a FCBGA semiconductor package 1 comprises a substrate 10 having a front surface 100 and a back surface 101, wherein a chip bonding area 102 is pre-defined on the front surface 100 of the substrate 10; a semiconductor chip 12 reflowed on the chip bonding area 102 of the substrate 10 in flip-chip manner via a plurality of solder bumps 11; a solder mask 16 for covering the back surface 101 of the substrate 10 in a manner as to expose a plurality of ball pads 18, which are implanted with a plurality of solder balls (not shown) thereon; and a particular encapsulating material 19 for encapsulating the semiconductor chip 12 and the solder bumps 11. This encapsulating material 19 is a low viscous epoxy resin containing a solid filler in 70% to 90%, and the solid filler consists of fine particles of silicon and quartz with a particle diameter of 0.01–0.05 mm.

The molded underfilling technology is characterized in that, after mounting the semiconductor chip 12 on the substrate 10, a molding process is performed in accompany with a cavity between the chip 12 and the substrate 10 being underfilled, and the encapsulating material 19 is injected into a mold (not shown) with a plurality of air vents 17 connected to the external for ventilating excess air so as to eliminate the occurrence of voids. However, due to the encapsulating material 19 having low viscosity (high fluidity) and fine fillers, it often unavoidably flashes around the air vents 17 after completing the molding process, as shown in FIG. 2. This therefore seriously deteriorates the quality and appearance of the FCBGA semiconductor package 1.

The use of such an encapsulating material having low viscosity and fine fillers helps reduce the filling and curing time. If this encapsulating material is applied to a conventional BGA semiconductor package, in correspondence to densely distributed bonding wires and small bond pitch of 50 µm or below formed on a semiconductor chip in the semiconductor package, the encapsulating material used in a molding process can therefore effectively reduce filling impact generated during injecting the encapsulating material, and prevent wire sweep from occurrence. However, the flash problem still can not be eliminated when the encapsulating material flows through a plurality of air vents located at corners, as shown in the drawing. Thus, how to solve the flash problem is a critical subject to endeavor.

SUMMARY OF THE INVENTION

A primary objective of the present invention is to provide a semiconductor package and a method for fabricating the same, in which flash of an encapsulating material can be prevented from occurring around air vents, so that the quality and appearance of the semiconductor package can be well maintained.

Another objective of the invention is to provide a semiconductor package and a method for fabricating the same, in which a molded underfilling technology is employed, and an encapsulating material having low viscosity and fine fillers can be used as to reduce the underfilling time.

A further objective of the invention is to provide a semiconductor package and a method for fabricating the same, in which an encapsulating material having low viscosity and fine fillers can be used to prevent flash thereof from occurring in a molded underfilled BGA semiconductor package with a highly integrated chip.

In accordance with the foregoing and other objectives, the present invention proposes a semiconductor package and a method for fabricating a semiconductor package. The semiconductor package of the invention comprises: a substrate mounted with at least one semiconductor chip thereon and electrically connected to the semiconductor chip; and an encapsulant for encapsulating the semiconductor chip, and formed with a plurality of outwardly-extending protruding portions, which are dimensioned to be smaller in height than the encapsulant.

The method for fabricating a semiconductor package of the invention comprises the steps of: preparing a substrate mounted with at least one semiconductor chip thereon via a plurality of conductive elements; providing a mold having a molding cavity dimensioned to accommodate the semiconductor chip therein, wherein the molding cavity is formed with a plurality of recess portions, which are dimensioned to be relatively smaller in height than the molding cavity, and the mold is formed with a plurality of air vents for interconnecting the recess portions and outside of the mold; and placing the substrate with the semiconductor chip mounted thereon in the mold, and injecting a molding compound into the molding cavity to encapsulate the semiconductor chip.

Due to the recess portions relatively smaller in height, the molding compound more rapidly absorbs heat transmitted from the mold and thus slows down its flow when flowing into the recess portions of the molding cavity The slowed down molding compound with increased viscosity can therefore be prevented from flashing out of the air vents, so that quality and appearance of the fabricated semiconductor package can be well assured.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF TILE PREFERRED EMBODIMENTS

A semiconductor package and a method for fabricating a semiconductor package proposed in the present invention are fully described in the following embodiments with reference to FIGS. 3–7, wherein the method is applicable for fabricating all types of BGA (ball grid array) semiconductor packages, and a FCBGA (flip chip ball grid array) semiconductor package is exemplified herein, in an effort to depict a molded underfilling technology in detail.

Figure 1:
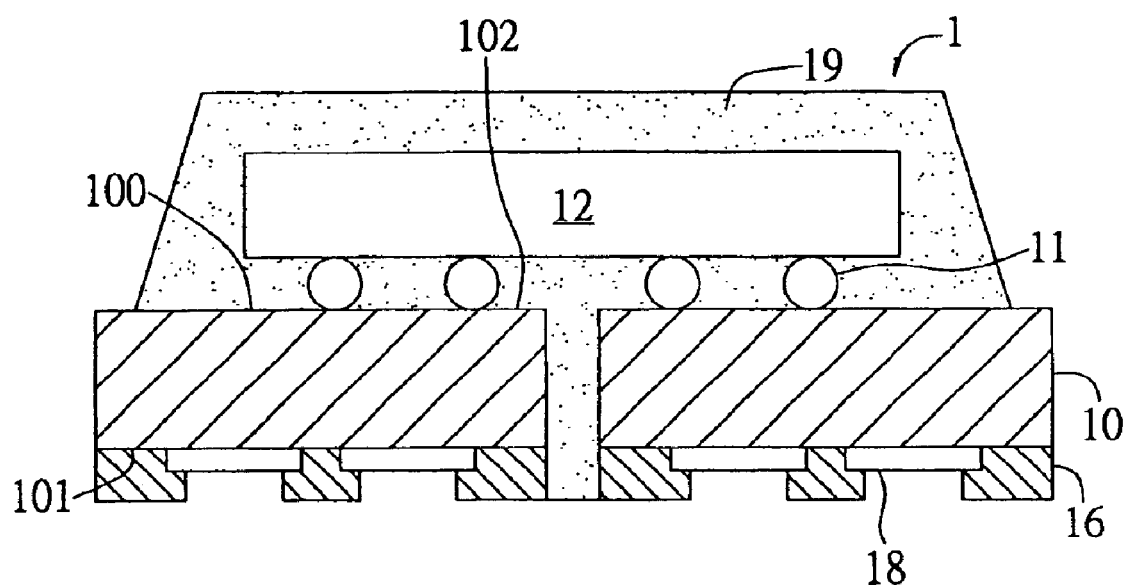
FIG. 1 (PRIOR ART) is a sectional view of a FCBGA semiconductor package disclosed in the U.S. Pat. No. 6,038, 136.
Figure 2:
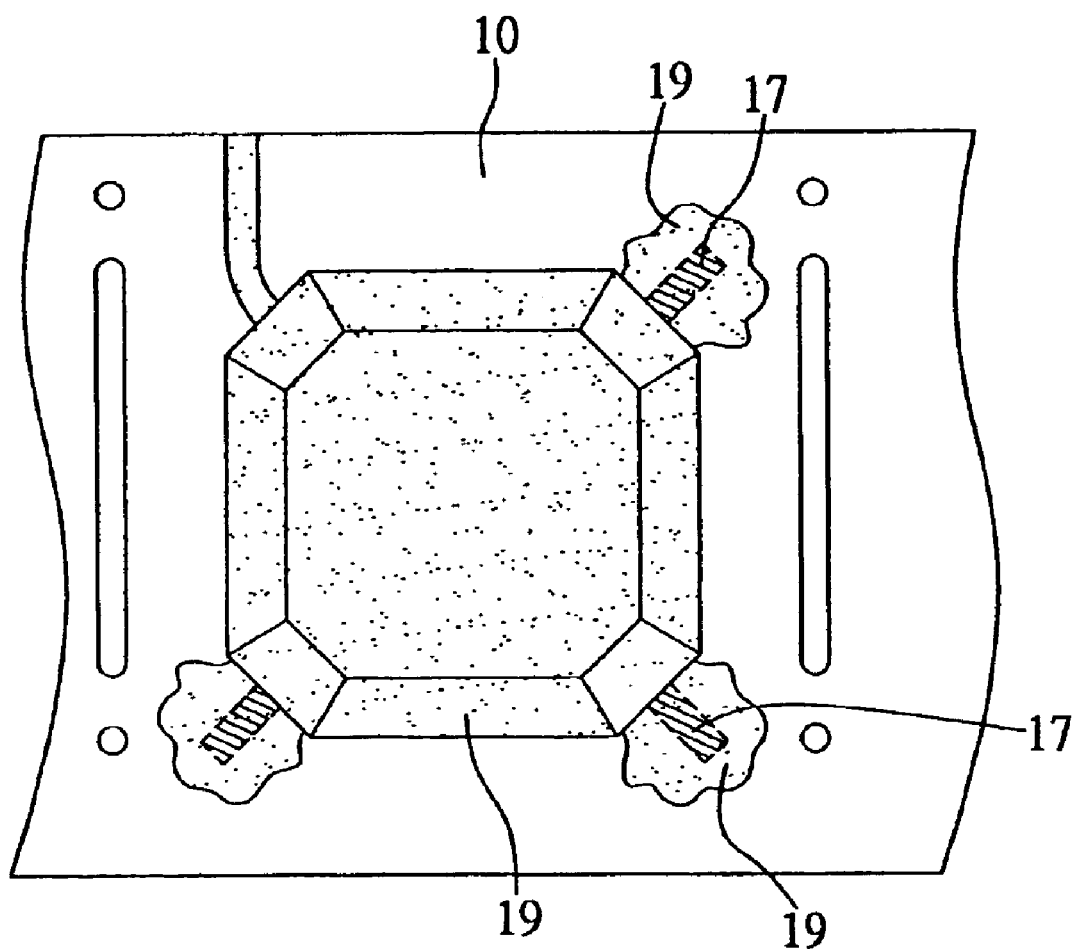
FIG. 2 (PRIOR ART) is a top view of a conventional BGA semiconductor package with flash occurring around air vents.
Figure 3A:
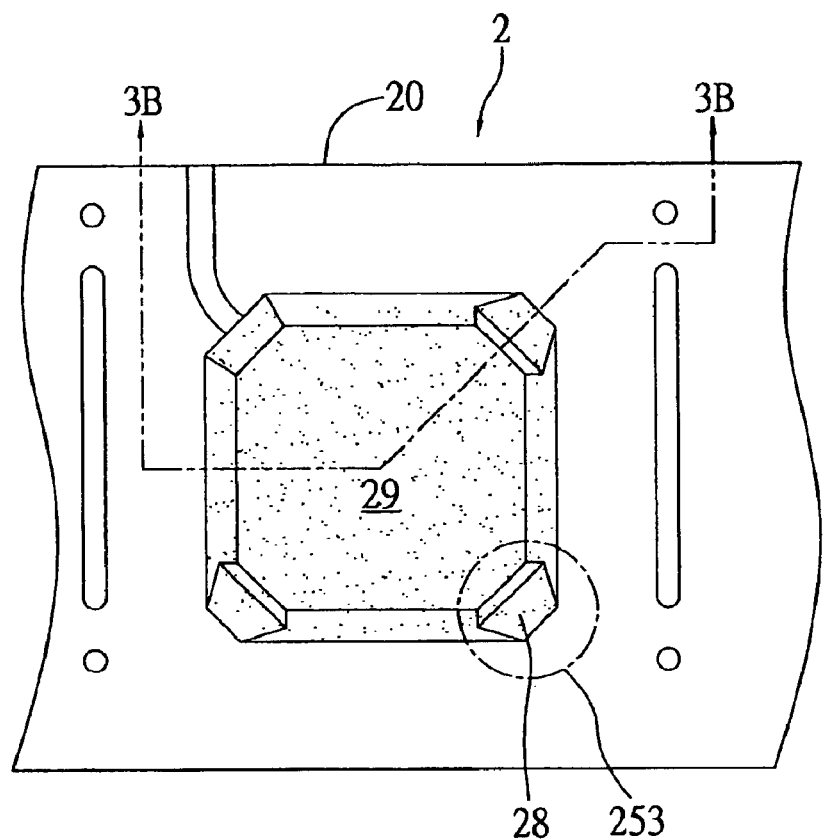
FIG. 3A is a top view of a BGA semiconductor package of the invention.
Figure 3B:
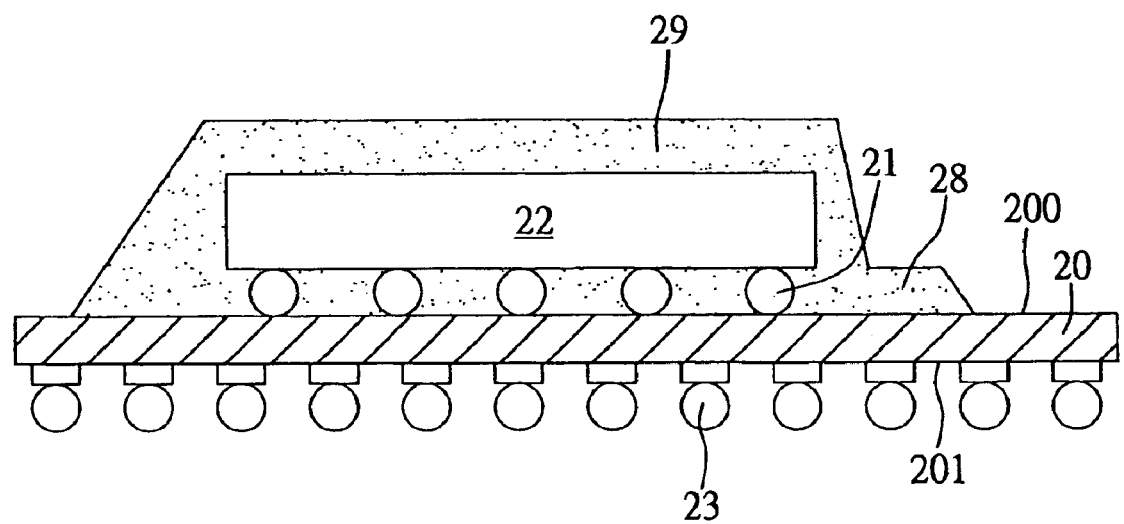
FIG. 3B is a sectional view of FIG. 3A cutting along a line 3B—3B.

FIGS. 3A and 3B illustrate a top view and a sectional view of a BGA semiconductor package 2 of the invention, respectively. As shown in the drawings, the BGA semiconductor package 2 comprises a substrate 20; a semiconductor chip 22 reflowed on the substrate 20 by a plurality of solder bumps 21; a plurality of solder balls 23 implanted on a back surface 201 of the substrate 20 for electrically connecting the semiconductor chip 22 to external devices; and an encapsulant 29 for encapsulating the semiconductor chip 22, and formed with a plurality of outwardly-extending portions 28, which are relative smaller in thickness and located corresponding to corner positions 253 of a molding cavity (not shown).

Figure 4:
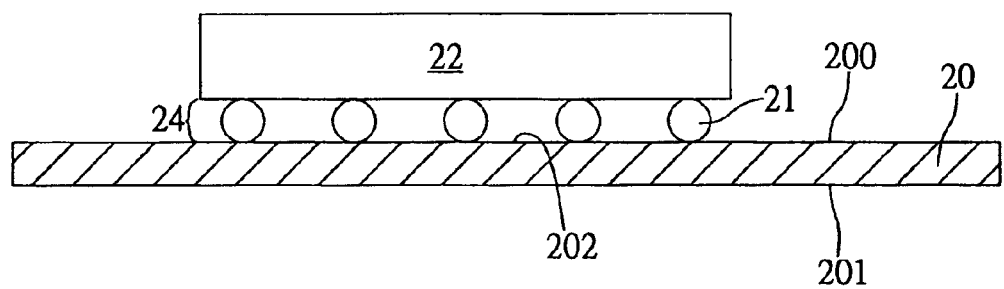
FIG. 4 is a sectional view of a FCBGA semiconductor package without carrying out a molded underfilling process.

As shown in FIG. 4, a substrate 20 having a front surface 200 and a back surface 201 is prepared, wherein a chip bonding area 202 is predefined on the front surface 200 of the substrate 20; a semiconductor chip 22 is bonded onto the chip bonding area 202 of the substrate 20 in a flip-chip manner via a plurality of solder bumps 21; and a plurality of ball pads (not shown) disposed on the back surface 201 of the substrate 20 are used to implant a plurality of solder balls (not shown) thereon in a subsequent process. Then, after the semiconductor chip 22 is bonded in position, a cavity 24 is formed between the semiconductor chip 22 and the substrate 20 at intervals between the adjacent solder bumps 21. In order to reinforce joint strength between the solder bumps 21 and the substrate 20, a flip chip underfilling process is necessarily performed.

Figure 5:
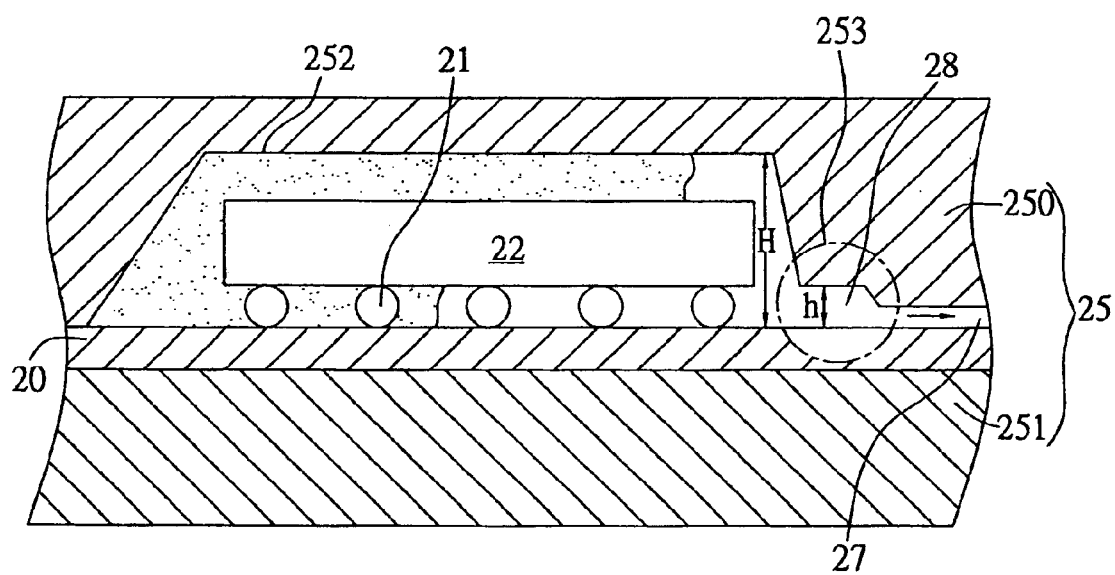
FIG. 5 is a sectional view of a FCBGA semiconductor package in a molding process in the use of a method for fabricating a semiconductor package of the invention.
Figure 6:
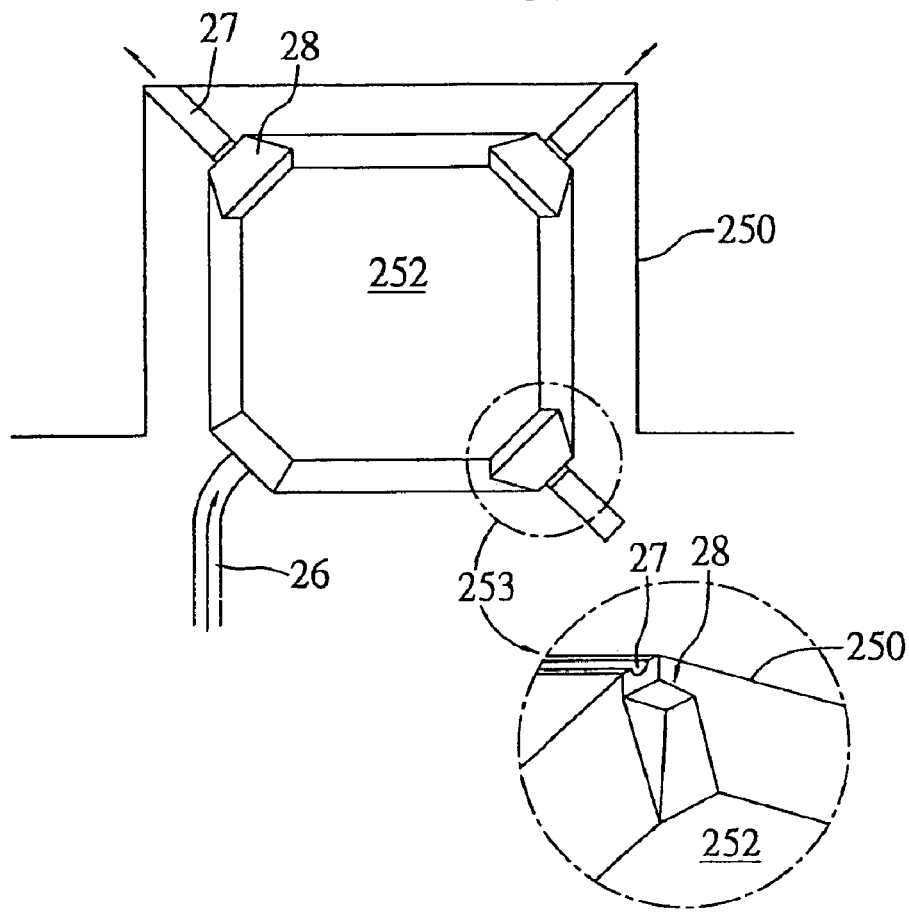
FIG. 6 is a bottom view of an upper mold of a mold used in a molding process of a method for fabricating a semiconductor package of the invention.
Figure 7:
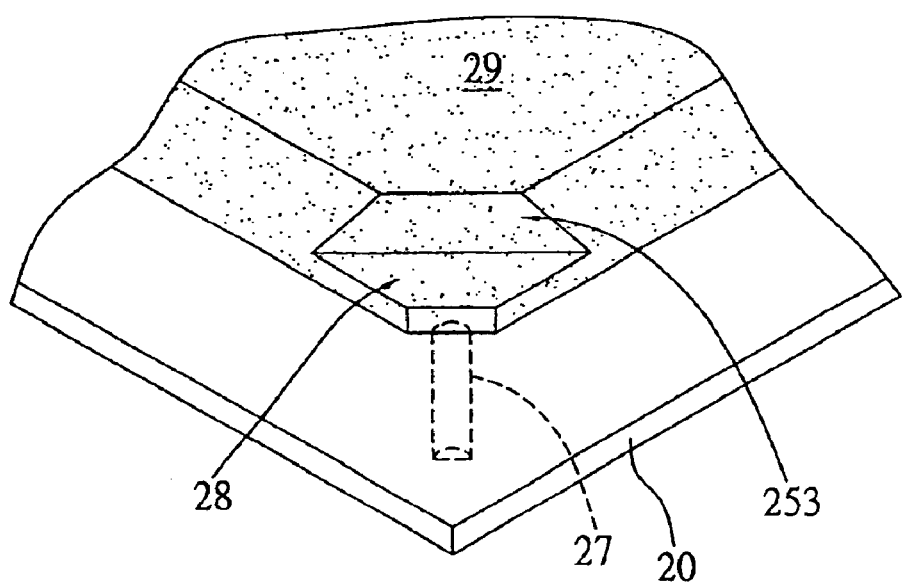
FIG. 7 is a topical magnified view of a flash preventing structure used in a method for fabricating a semiconductor package of the invention.

In the invention, a molded underfilling technique is employed, i.e. molding and flip chip underfilling processes are accomplished simultaneously. As shown in FIGS. 5 and 6 (a bottom view of an upper mold), a substrate 20 having a semiconductor chip 22 mounted thereon is placed into a mold 25, which consists of an upper mold 250 having a molding cavity 252 for accommodating the chip 22, and a lower mold 251 to be engaged with the upper mold 250. At corner positions 253 of the molding cavity 252 of the upper mold 250, besides one formed with a runner 26, the others are provided with a plurality of air vents 27 connected to outside, so as to ventilate air in the molding cavity 252 and eliminate void formation during injecting a molding compound used in the molding process. Since the foregoing description is accomplished by using conventional techniques, it is not further detailed herein. It is to be noted that the invention is characterized in forming a plurality of recess portions 28 connected to the air vents 27 in proximity to the corner positions 253 of the molding cavity 252. As such, the recess portions 28 has a height h much smaller than a height H of the molding cavity 252, thereby making an encapsulant 29 formed at the recess portions 28 into protruding portions (designated by the same reference numeral 28 as the recess portions) of only 0.3–1.0 mm in thickness, as shown in FIG. 7.

Figure 8:
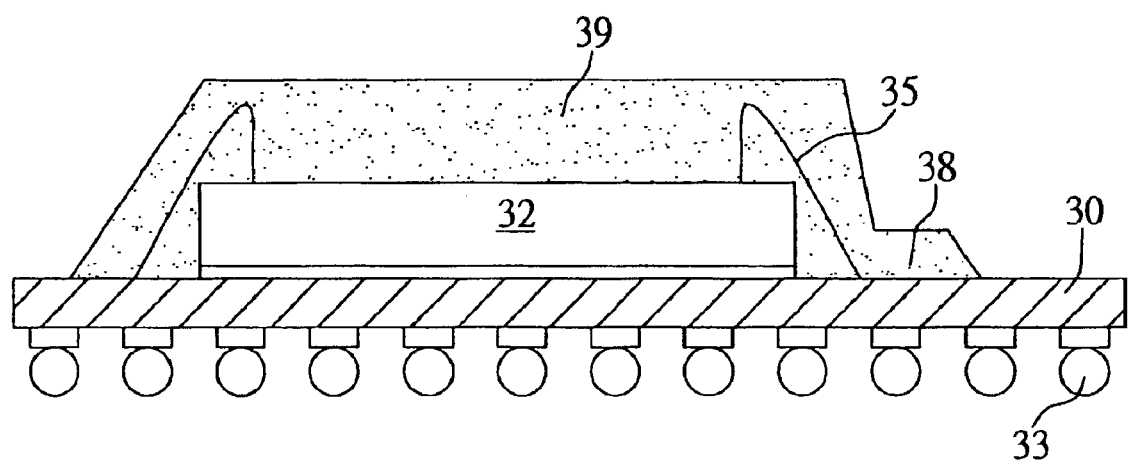
FIG. 8 is a sectional view of a fine pitch BGA semiconductor package in use of a method for fabricating a semiconductor package of the invention.

In order to shorten the filling and curing time in the flip chip underfilling process, the encapsulant 29 of the BGA semiconductor package 2 is made of a molding resin such as epoxy resin (designated by the same numeral 29 as the encapsulant) having low viscosity, high fluidity and small fine filler size. After the molding resin 29 flows into the recess portions 28 at the corner positions 253 in the molding cavity 252, due to the relative smaller height h of the recess portions 28, the molding resin 29 more rapidly absorbs heat transmitted from the mold 25, resulting in increase in the viscosity and decrease in the flow rate of the molding resin 29. The slowed down molding resin 29 can therefore be prevented from flashing out of the air vents 27. Such a flash preventing method is also applicable to a molding process for encapsulating a fine pitch chip 32. As shown in FIG. 8, in the provision of recess portions 38 for preventing resin flash from occurrence, a molding resin 39 with even smaller fine filler size and higher fluidity can be used during molding. This not only reduces resin filling impact and wire sweep, but also increases the variety of materials applicable for making an encapsulant 39.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a substrate mounted with at least one semiconductor chip thereon and electrically connected to the semiconductor chip; and
    an encapsulant formed by a molding compound injected into a molding cavity of a mold for encapsulating the semiconductor chip mounted on the substrate, wherein the molding cavity is formed with a plurality of recess portions at corner positions thereof, and the recessed portions are dimensioned to be relatively smaller in height than the molding cavity and are each connected to an air vent formed in the mold for interconnecting the recess portions and outside of the mold, such that the encapsulant is formed with a plurality of outwardly-extending portions by the molding compound filled in the recess portions of the molding cavity, and the outwardly-extending portions are located in positions corresponding to the corner positions of the molding cavity.

2. The semiconductor package of claim 1, wherein the semiconductor package is a BGA (ball grid array) semiconductor package.

3. The semiconductor package of claim 1, wherein the semiconductor package is a FCBGA (flip chip ball grid array) semiconductor package.

4. The semiconductor package of claim 1, wherein the molding compound is an epoxy resin having low viscosity, high fluidity and small fine filler size.

5. The semiconductor package of claim 1, wherein a molded underfilling technique is employed for injecting the molding compound.

* * * * *